US011037761B2

(12) United States Patent
Haga

(10) Patent No.: US 11,037,761 B2
(45) Date of Patent: Jun. 15, 2021

(54) CONTROL METHOD AND PLASMA PROCESSING APPARATUS

(71) Applicant: Tokyo Electron Limited, Tokyo (JP)

(72) Inventor: Toshio Haga, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/704,140

(22) Filed: Dec. 5, 2019

(65) Prior Publication Data

US 2020/0185195 A1 Jun. 11, 2020

(30) Foreign Application Priority Data

Dec. 6, 2018 (JP) .............................. JP2018-229294

(51) Int. Cl.
*H01J 37/32* (2006.01)

(52) U.S. Cl.
CPC ... *H01J 37/32183* (2013.01); *H01J 37/32449* (2013.01); *H01J 37/32715* (2013.01); *H01J 2237/002* (2013.01); *H01J 2237/334* (2013.01)

(58) Field of Classification Search
CPC ........... H01J 37/32183; H01J 37/32715; H01J 37/32449; H01J 2237/002; H01J 2237/334
See application file for complete search history.

(56) References Cited

U.S. PATENT DOCUMENTS

2004/0065539 A1* 4/2004 Sosnowski ........ H01J 37/32174
 204/164
2019/0043695 A1* 2/2019 Wu ..................... C23C 16/5096

FOREIGN PATENT DOCUMENTS

JP 2017-073247 4/2017

* cited by examiner

*Primary Examiner* — Raymond R Chai
(74) *Attorney, Agent, or Firm* — IPUSA, PLLC

(57) ABSTRACT

There is provision of a method of controlling a plasma processing apparatus including a chamber in which a plasma is generated, a substrate holder, a radio frequency power supply configured to supply radio frequency electric power to the substrate holder, a matching device provided between the substrate holder and the radio frequency power supply. The method includes acquiring output impedance of the matching device in a state in which impedance matching is achieved; obtaining F-parameters indicating electrical characteristics of the chamber; calculating a degree of high harmonic component generation; and controlling the output impedance of the matching device based on the degree of high harmonic component generation.

4 Claims, 6 Drawing Sheets

FIG.6
| | NO.1 | NO.2 | NO.3 | NO.4 |
|---|---|---|---|---|
| LOWER ELECTRODE IMPEDANCE (FUNDAMENTAL: 40 MHz) | 31.8+j90.1 Ω | 33.4+j92.3 Ω | 35.8+j96.3 Ω | 32.4+j87.7 Ω |
| LOWER ELECTRODE IMPEDANCE (HIGH HARMONIC: 122 MHz) | 0.8+j25.0 Ω | 0.8+j24.9 Ω | 1.5+j20.0 Ω | 4.5+j33.2 Ω |
| CAPACITANCE OF "SHEATHS + UPPER INSULATOR" | 43.4 pF | 42.4 pF | 46.9 pF | 44.6 pF |
| HIGH HARMONIC IMPEDANCE SEEN FROM PLASMA | 0.8−j5.0 Ω | 0.8−j5.9 Ω | 1.5−j12.1 Ω | 4.5+j3.9 Ω |
| DEGREE OF HIGH HARMONIC COMPONENT GENERATION | 30.1 mS | 22.2 mS | 10.2 mS | 125.9 mS |
| ETCHING RATE OF SiO₂ FILM | 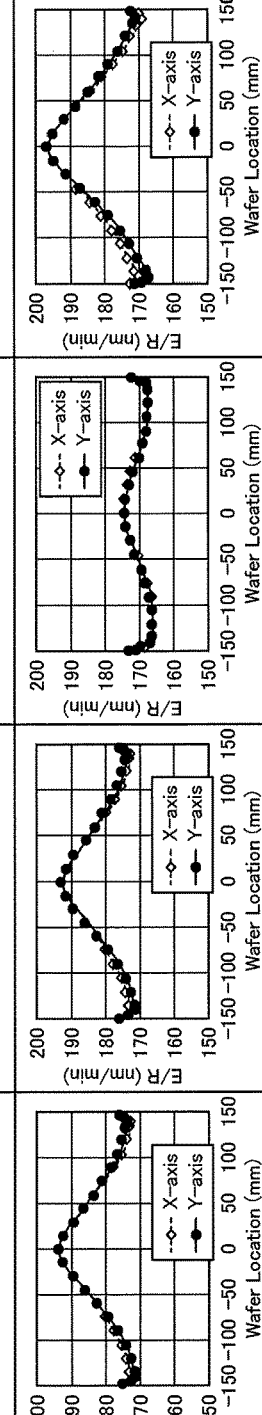 180.2 nm ± 6.4% | 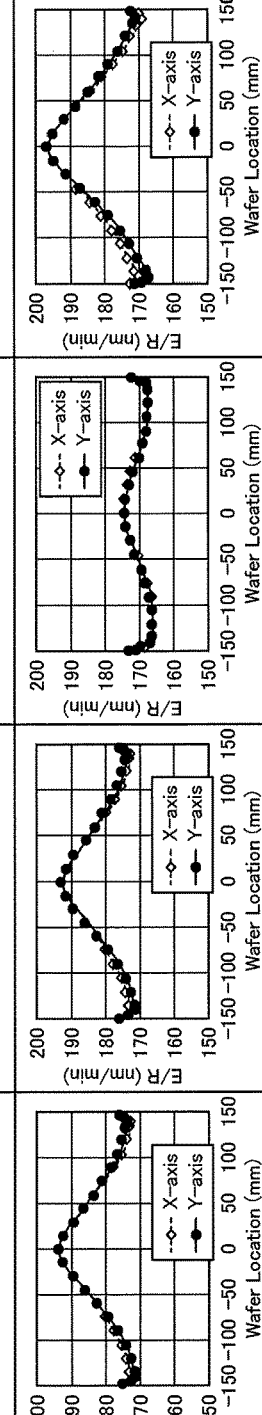 180.0 nm ± 5.9% | 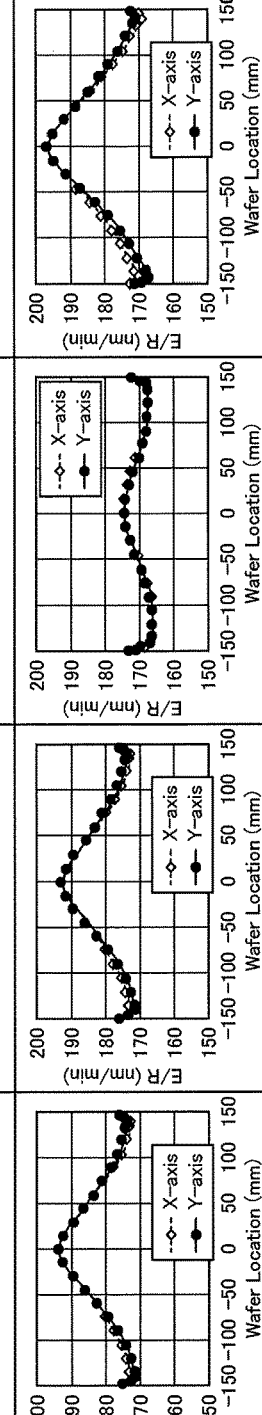 170.0 nm ± 2.4% | 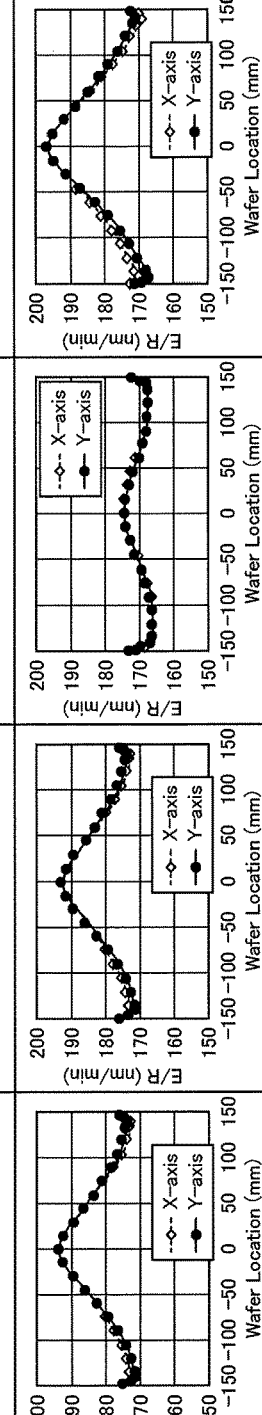 179.7 nm ± 8.1% |

CONTROL METHOD AND PLASMA PROCESSING APPARATUS

CROSS-REFERENCE TO RELATED APPLICATIONS

This patent application is based upon and claims priority to Japanese Patent Application No. 2018-229294 filed on Dec. 6, 2018, the entire contents of which are incorporated herein by reference.

TECHNICAL FIELD

The present disclosure relates to a control method and a plasma processing apparatus.

BACKGROUND

It is useful to observe and control high harmonic components generated by a plasma processing apparatus in order to counteract process condition dependence and differences among plasma processing apparatuses. A possible approach is to adjust impedance of a matching device with respect to high harmonic components, while observing the high harmonic components using a sensor such as an RF sensor or an impedance sensor. Patent Document 1 discloses a method of installing an impedance sensor at a side of an RF power supply, and adjusting impedance using the sensor.

CITATION LIST

[Patent Document]
[Patent Document 1] Japanese Laid-open Patent Application Publication No. 2017-073247

SUMMARY

The present disclosure provides a technique that can adjust the impedance of the matcher to harmonics without using sensors.

According to one aspect of the present disclosure, there is provision of a method of controlling a plasma processing apparatus including a chamber in which a plasma is generated, a substrate holder, a radio frequency power supply configured to supply radio frequency electric power to the substrate holder, a matching device provided between the substrate holder and the radio frequency power supply. The method includes acquiring output impedance of the matching device in a state in which impedance matching is achieved; obtaining F-parameters indicating electrical characteristics of the chamber; calculating a degree of high harmonic component generation; and controlling the output impedance of the matching device based on the degree of high harmonic component generation.

BRIEF DESCRIPTION OF THE DRAWINGS

FIG. 6 illustrates examples of results of performing the method of controlling the degree of high harmonic component generation according to the embodiment.

DETAILED DESCRIPTION OF EMBODIMENTS

Hereinafter, embodiments for carrying out the present disclosure will be described with reference to the drawings. In the present specification and the drawings, elements having substantially identical features are given the same reference symbols, and overlapping descriptions may be omitted.

[Overall Configuration of Plasma Processing Apparatus]

Figure 1:
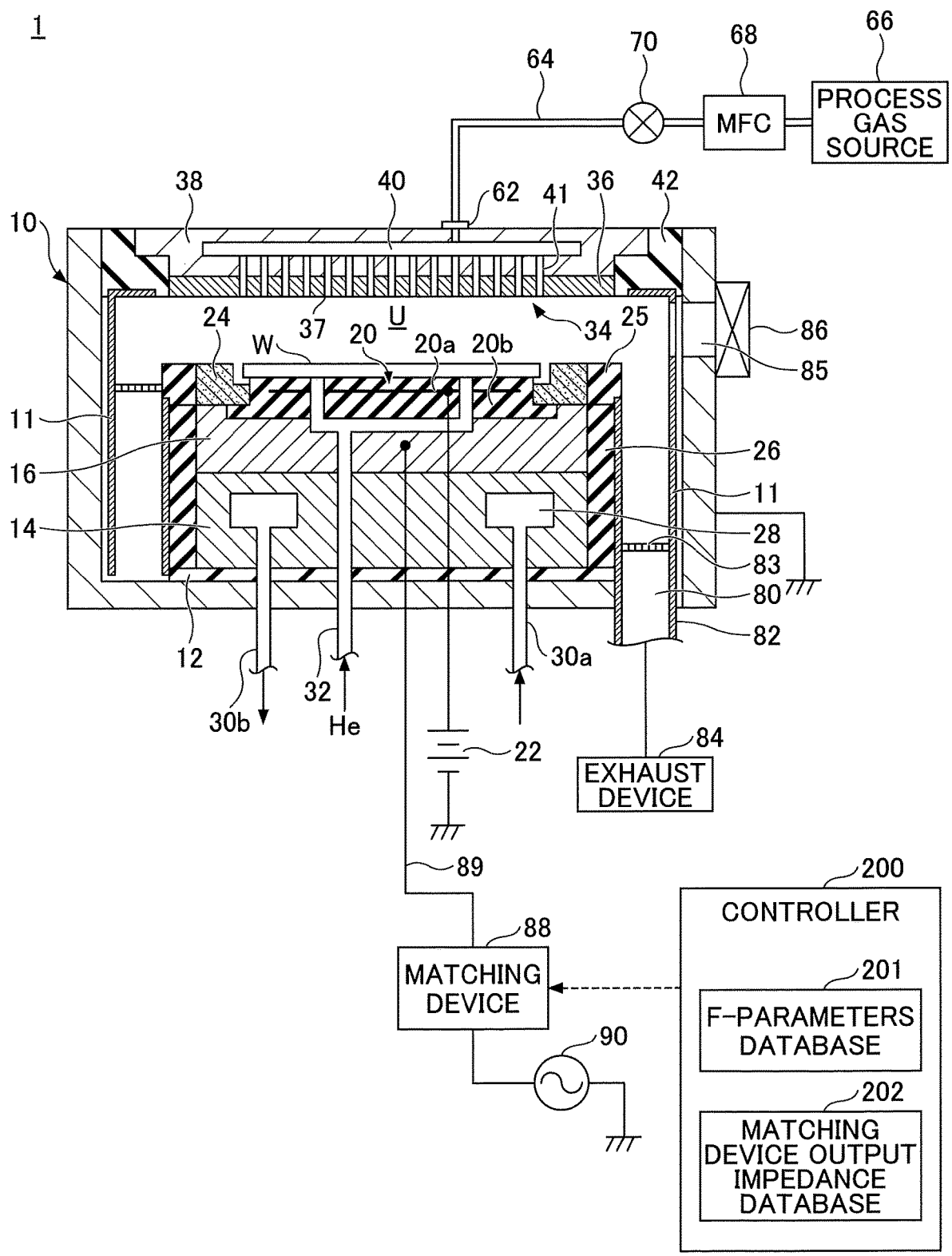
FIG. 1 is a longitudinal cross-sectional view illustrating an example of a plasma processing apparatus according to an embodiment.

First, an example of a plasma processing apparatus 1 according to an embodiment will be described with reference to FIG. 1. FIG. 1 is a diagram illustrating an example of the plasma processing apparatus 1 according to the embodiment. The plasma processing apparatus 1 according to the present embodiment is a parallel plate capacitively coupled plasma processing apparatus having a cylindrical chamber 10 that is made of aluminum with an anodized surface for example. The chamber 10 is grounded.

A cylindrical support 14 is disposed at the bottom of the chamber 10 via an insulating plate 12, which may be made of a ceramic or the like, and a substrate holder 16, for example, made of aluminum, is disposed on the support 14. The substrate holder 16 comprises a lower electrode on which an electrostatic chuck 20 is provided.

A wafer W is held on the electrostatic chuck 20. The electrostatic chuck 20 is configured such that an electrode 20a made of a conductive film is embedded in an insulating layer 20b. A direct current (DC) power supply 22 is connected to the electrode 20a, and the wafer W is held by the wafer W being attracted to the electrostatic chuck 20 by an electrostatic force such as Coulomb force produced by the DC voltage from the DC power supply 22.

On the substrate holder 16, a conductive edge ring 24 (also referred to as a focus ring) made of silicon, for example, is disposed on a periphery of the wafer W. A cylindrical inner wall member 26, such as quartz, is provided on an outer periphery of the substrate holder 16 and the support 14. On an outer periphery of the edge ring 24, a ring-like lower insulator ring 25 is provided, which is made of quartz or the like.

Inside the support 14, a refrigerant chamber 28 is provided near a circumference of the support 14 for example. A coolant at a predetermined temperature, such as cooling water, is supplied to the refrigerant chamber 28 from a chiller unit provided externally, through pipes 30a and 30b, and a processing temperature of the wafer W on the substrate holder 16 is controlled by the coolant. In addition, heat transfer gas such as He gas is supplied between an upper surface of the electrostatic chuck 20 and a back surface of the wafer W, from a heat transfer gas supply mechanism through a gas supply line 32.

Above the substrate holder 16, an upper electrode 34 is provided facing the substrate holder 16. Between the upper electrode 34 and the lower electrode (substrate holder 16) is a plasma processing space U.

The upper electrode 34 is supported to a ceiling of the chamber 10 via an insulating upper insulator ring 42. The upper electrode 34 includes an electrode plate 36 facing the substrate holder 16 and having multiple gas discharge holes 37, and includes an electrode support 38 made of a conductive material such as anodic oxidized aluminum, which detachably supports the electrode plate 36. The electrode plate 36 is preferably made of silicon or SiC. Inside the electrode support 38, a gas diffusion chamber 40 is provided, through which a large number of gas holes 41 communicating with the gas discharge holes 37 extend downwardly.

A gas inlet 62 that guides a process gas to the gas diffusion chamber 40 is provided at the electrode support 38. To the gas inlet 62, a gas supply line 64 is connected, and a process gas source 66 is connected to the gas supply line 64. On the gas supply line 64, from the upstream side where the process gas source 66 is located, a mass flow controller (MFC) 68 and an open/close valve 70 are provided in an order of the MFC 68 and the open/close valve 70. A process gas is supplied from the process gas source 66 to the gas diffusion chamber 40 through the gas supply line 64, and the process gas is supplied, through the gas holes 41, from the gas discharge holes 37 to the plasma processing space U in a shower-like manner. Accordingly, the upper electrode 34 functions as a showerhead for supplying a process gas.

A high frequency power supply 90 (may also be referred to as a radio frequency power supply 90) is connected to the lower electrode (substrate holder 16) via a matching device 88 and a feed rod (cable) 89. The high frequency power supply 90 applies high frequency electric power for plasma generation to the substrate holder 16. The high frequency electric power for plasma generation is an example of RF power. In the present embodiment, a case in which RF power is the high frequency electric power for plasma generation is described. Frequency of the high frequency electric power (RF power) may be from 40 MHz to 60 MHz. The matching device 88 causes output impedance of the high frequency power supply 90 to match impedance of a load.

A high frequency power supply for applying high frequency power for attracting ions to the substrate holder 16 via a power supply rod (cable) and a matching device may be provided. This causes ions to be drawn into the wafer W on the substrate holder 16. The high frequency power supply to apply high frequency power for attracting ions may output high frequency power of a frequency within a range of 2 MHz to 13.56 MHz. The high frequency power for attracting ions is an example of RF power.

A vent 80 is provided at a bottom of the chamber 10, and an exhaust device 84 is connected to the vent 80 via an exhaust pipe 82. The exhaust device 84 includes a vacuum pump such as a turbomolecular pump, which can reduce pressure in the chamber 10 to a desired quality of vacuum. At a side wall of the chamber 10, a loading/unloading port 85 for a wafer is provided, which can be opened and closed by a gate valve 86. A deposition shield 11 is also provided detachably along an inner wall of the chamber 10, to prevent deposition of by-products generated during etching or the like into the chamber 10. The deposition shield 11 is also provided on an outer periphery of the inner wall member 26 and on a part of the ceiling. A baffle plate 83 is provided between the deposition shield 11 provided on a wall of the chamber 10 at a lower portion and the deposition shield 11 provided on the inner wall member 26. The deposition shield 11 and the baffle plate 83 may be made of an aluminum coated with a ceramic material such as $Y_2O_3$.

When an etching process is performed in the plasma processing apparatus 1 having the above-described configuration, the gate valve 86 is first opened, and the wafer W is loaded into the chamber 10 via the loading/unloading port 85 and mounted on the substrate holder 16. The process gas source 66 supplies gas for plasma treatment, such as etching, at a predetermined flow rate, into the chamber 10 via the gas diffusion chamber 40, the gas holes 41 and the gas discharge holes 37. Also, the exhaust device 84 evacuates the chamber 10, to set pressure in the chamber 10 to pressure for a process condition.

Subsequently, during a state in which the gas is introduced in the chamber 10, RF power is applied from the high frequency power supply 90 to the substrate holder 16. Further, DC voltage is applied to the electrode 20a from the DC power supply 22 so that the wafer W is held on the substrate holder 16 by electrostatic attractive force.

A plasma generator generates a plasma from the gas introduced into the chamber 10 (the plasma processing space U) by RF power. Plasma treatment such as etching is applied to a surface of the wafer W by radicals or ions in the plasma.

The plasma processing apparatus 1 is provided with a controller 200 for controlling an entire operation of the plasma processing apparatus 1. The controller 200 includes, for example, a processor (central processing unit [CPU]) and a memory device such as a read-only memory (ROM) or a random access memory (RAM) that can store a computer program (may also be referred to as a "program") executed by the processor. In the memory device, a recipe is also stored. By the program in the memory device being executed by the processor, the controller 200 performs plasma treatment such as etching, according to the recipe. The recipe includes information indicating a procedure and a condition of a process such as plasma treatment. The recipe may include process time, pressure (gas exhaust), magnitude of high frequency power, voltage, and various gas flow rates, which are control information of the plasma processing apparatus 1 with respect to a process condition. The recipe may also include a temperature in the chamber (upper electrode temperature, chamber side wall temperature, wafer W temperature, electrostatic chuck temperature, etc.), a temperature of the coolant output from the chiller, and the like. The recipe may be stored on a hard disk or a semiconductor memory. The recipe may also be stored in a portable computer-readable storage medium such as a CD-ROM or a DVD, and the portable computer-readable storage medium storing the recipe may be set to a predetermined location so that the recipe can be read out from the portable computer-readable storage medium.

The controller 200 includes an F-parameters database 201 and a matching device output impedance database 202. The F-parameters indicate electrical characteristics of the chamber 10, and are measured in advance by using the chamber 10. As an example of the measurement method, a jig is attached to the lower electrode, and impedance of the lower electrodes in three cases is measured with a measuring instrument provided at the jig. An example of the impedance of the lower electrode (may also be referred to as "lower electrode impedance") in three cases is impedance when a resistor of predetermined magnitude (50Ω, etc.) is attached to the lower electrode, impedance when the lower electrode is short-circuited, and impedance when the lower electrode is open-circuited. However, the method of measuring the impedance of the lower electrode is not limited thereto.

From the impedance in the three cases, the F-parameters of a fundamental component and the F-parameters of the high harmonic component are identified, and the identified F-parameters are stored in the F-parameters database 201. The F-parameters of the fundamental component and the high harmonic component are prepared as a database in advance.

Figure 2:
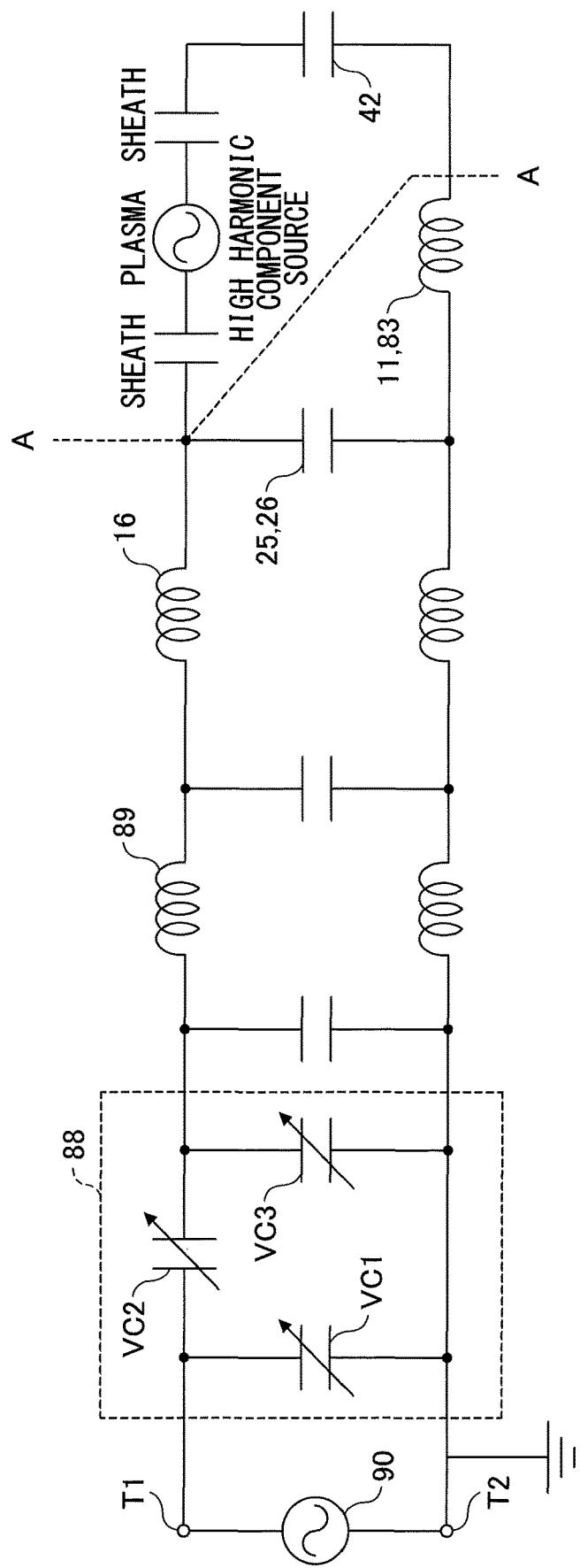
FIG. 2 is a diagram illustrating an example of a high harmonic component generation model according to the embodiment.

As illustrated in FIG. 2, the matching device 88 includes a variable capacitor VC3 in addition to a variable capacitor VC1 and a variable capacitor VC2. The variable capacitor VC3 is used to adjust impedance to a high harmonic component. One end of the variable capacitor VC1 is connected with a terminal T1 of the high frequency power supply 90, and the other end of the variable capacitor VC1 is connected with a terminal T2 of the high frequency power supply 90. Similarly, with respect to the high frequency power supply 90, one end of the variable capacitor VC3 is connected with the terminal T1 via the variable capacitor VC2, and the other end of the variable capacitor VC3 is connected with the terminal T2. The variable capacitor VC2 is connected between the one end of the variable capacitor VC1 and the one end of the variable capacitor VC3. That is, the variable capacitor VC1 is connected in parallel with the high frequency power supply 90. The variable capacitor VC2 is connected in series with the high frequency power supply 90. The variable capacitor VC3 is connected in parallel with the high frequency power supply 90, and is disposed at the opposite side of the variable capacitors VC1 and VC2 with respect to the high frequency power supply 90. The variable capacitor VC1 is an example of a first variable capacitor connected in parallel with the high frequency power supply 90. The variable capacitor VC2 is an example of a second variable capacitor connected in series with the high frequency power supply 90. The variable capacitor VC3 is an example of a third variable capacitor that is connected in parallel with the first variable capacitor and is disposed at a position closer to the substrate holder 16 relative to the first variable capacitor and the second variable capacitor.

The output impedance of the matching device 88 is measured, for example, by changing magnitude of the variable capacitors VC1, VC2, and VC3. For example, each of the variable capacitors VC1, VC2, and VC3 is set to 100 values of magnitude during measurement, and for $100^3$ combinations of the magnitude of the variable capacitors VC1, VC2, and VC3, the output impedance of the fundamental component and the output impedance of the high harmonic component are measured. The matching device output impedance database 202 stores the output impedance of the fundamental component and the output impedance of the high harmonic component that are measured on $100^3$ combinations. However, the method of measuring the output impedance of the matching device 88 is not limited thereto. The output impedance of the fundamental component and the output impedance of the high harmonic component are prepared as a database in advance.

[Model of High Harmonic Generation]

Next, a model of generating a high harmonic component occurring in the chamber 10 of the plasma processing apparatus 1 according to the present embodiment will be described with reference to FIG. 2. FIG. 2 is a diagram illustrating an example of a high harmonic component generation model according to the present embodiment. The radio frequency power supply 90 is connected to the bottom electrode via the matching device 88 and the feed rod 89. An upper insulator ring 42 is disposed on the side of the upper electrode 34 facing the lower electrode. When a plasma is generated in the plasma processing space U, a sheath is formed on the lower electrode side and a sheath is formed on the upper electrode side. As illustrated in FIG. 2, when seen from the high frequency power supply 90, the plasma (and the sheaths) generated in the plasma processing space U (between the upper electrode and the lower electrode) can be regarded as a type of load having a certain amount of impedance (capacitance). To be correct, from the high frequency power supply 90, the plasma and the sheaths generated in the plasma processing space U can be regarded as a load having impedance (capacitance) of a sheath generated near the lower electrode, impedance (capacitance) of a sheath generated near the upper electrode, and impedance (capacitance) of the upper insulator ring 42. In the present embodiment, the impedance of the load (plasma) is referred to as "plasma impedance".

With respect to the left side of the A-A line of FIG. 2, on the side of the lower electrode, there are members having inductive components, such as the lower electrode (the substrate holder 16), the feed rod 89, the deposition shield 11, and the baffle plate 83, and members having capacitive components such as the lower insulator ring 25 and the inner wall member 26.

The magnitude of a high harmonic component to be generated depends on high harmonic impedance seen from the plasma. When the plasma is generated, by oscillation of a sheath in accordance with a state of the plasma, the fundamental component of the RF power is modulated and thereby the high harmonic component is generated. Thus, the inventor considered the plasma as a source of the high harmonic component, and estimated high harmonic impedance seen from the plasma by calculation. Note that a definition of "impedance seen from the plasma" in the present embodiment is as follows. The plasma can be regarded as an ideal power source (not having impedance) of the high harmonic component as illustrated in FIG. 2. When seen from the ideal power source (plasma), a sheath generated near the lower electrode, a sheath generated near the upper electrode, the upper insulator ring 42, and circuit elements provided between the high frequency power supply 90 and the lower electrode (left side portion of the circuit in FIG. 2 from the line A-A) may be regarded as a load connected to the ideal power source (plasma). Thus, in the present embodiment, impedance calculated from capacitance of a sheath generated near the lower electrode, capacitance of a sheath generated near the upper electrode, capacitance of the upper insulator ring 42, and the lower electrode impedance is referred to as the "impedance seen from the plasma".

The inventor also found a method of controlling impedance to a high harmonic component, which provides a variable capacitor VC3 in the matching device 88 and adjusts the impedance to the high harmonic component using the variable capacitor VC3. The variable capacitor VC3 may be provided within the matching device 88, or it may be disposed on the output side of the matching device 88, between the matching device 88 and the substrate holder 16.

[Degree of High Harmonic Component Generation]

Next, a method for calculating a degree of high harmonic component generation will be described with reference to FIG. 3, which illustrates how high harmonic impedance seen from the plasma is seen. First, the matching device 88 is controlled so that the load impedance (impedance of the load seen from the high frequency power supply 90) is caused to approach a matching point. As used herein, "load impedance is caused to approach a matching point" means that the load impedance ideally matches output impedance of the high frequency power supply 90.

Next, with respect to the matching device 88 in which matching is achieved, the output impedance of the matching device 88 to the fundamental component and the output impedance of the matching device 88 to the high harmonic component are obtained by using the matching device output impedance database 202 prepared in advance.

Figure 3:
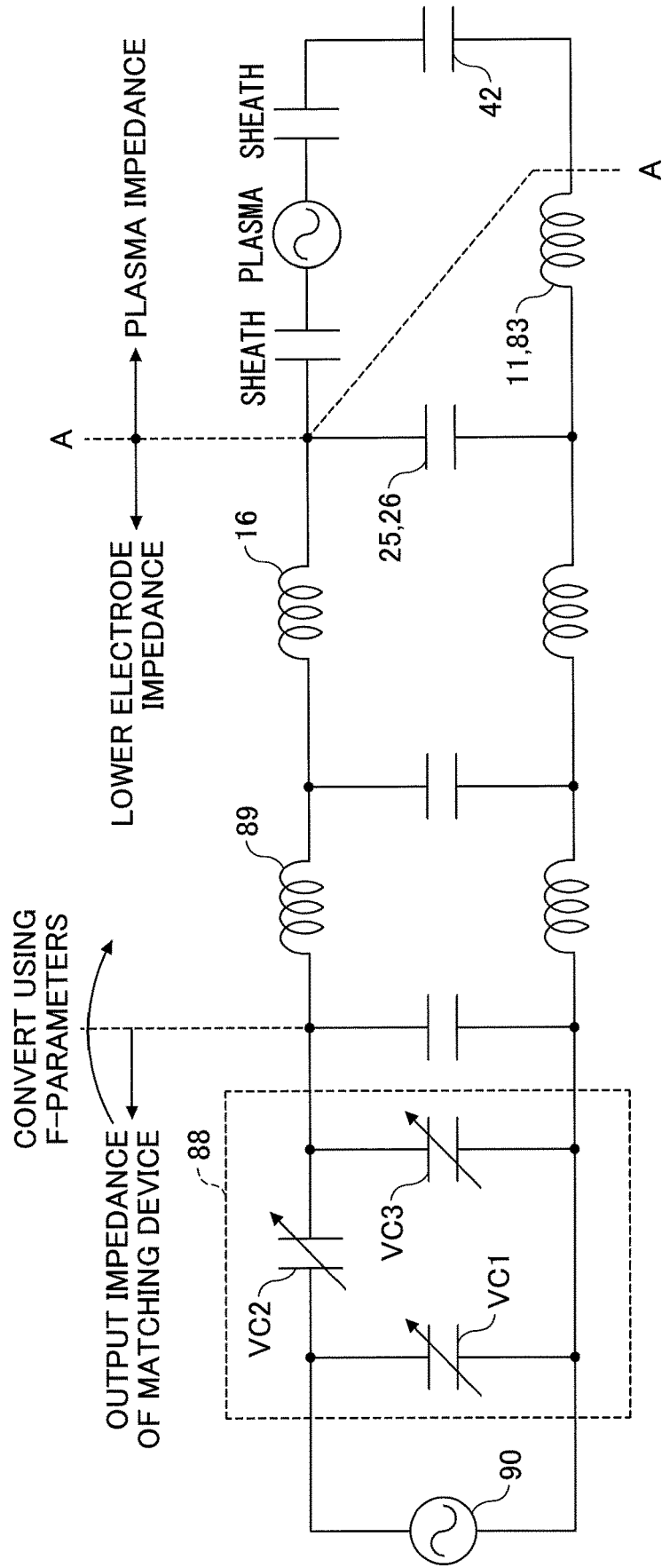
FIG. 3 is a diagram illustrating a method of controlling a high harmonic component according to the embodiment.

As illustrated in FIG. 3, of the output impedance of the matching device 88, the output impedance to the fundamental component can be converted to the lower electrode impedance to the fundamental component using the F-parameters of the fundamental component stored in the F-parameters database 201 in advance. Similarly, the output impedance to the high harmonic component can be converted to the lower electrode impedance to the high harmonic component using the F-parameters of the high harmonic component stored in the F-parameters database 201 in advance.

Next, a relationship between the lower electrode impedance (impedance of the substrate holder 16) and the plasma impedance will be described. Because of the matching device 88, impedance matching is achieved. Thus, a relation in which the lower electrode impedance to the fundamental component (or the high harmonic component) is a complex conjugate of the plasma impedance to the fundamental component (or the high harmonic component) is established. This allows calculation of the plasma impedance to the fundamental component (or the high harmonic component) from the lower electrode impedance to the fundamental component (or the high harmonic component). As a result, based on the calculated plasma impedance to the fundamental component (or the high harmonic component), it is possible to calculate a total capacitance $C_T$, which is a sum of capacitance of a sheath on the lower electrode side, capacitance of a sheath on the upper electrode side, and capacitance of the upper insulator ring 42.

A magnitude of generated high harmonic impedance seen from the plasma (hereinafter referred to as "harmonic component generation magnitude P") is obtained by the following formula (1).

$$P = RV^2/|Z|^2 \quad (1),$$

where V is voltage of the high harmonic component generated by the plasma, R is high harmonic resistance seen from the plasma, and Z is the high harmonic impedance seen from the plasma.

As V may be regarded as a constant value under same process conditions, the formula (1) is described as the following formula (2) in a simplified manner.

$$P \propto \frac{R}{|Z|^2} \quad (2)$$

The right term $(R/|Z|^2)$ in the formula (2) indicates a degree of high harmonic component generation. Z in the formula (2) can be calculated from the total capacitance $C_T$ of a sheath on the lower electrode, a sheath on the upper electrode, and the upper insulator ring 42, and the lower electrode impedance to the high harmonic component. R in the formula (2) is a real part of Z. As previously described, the output impedance of the matching device 88 with respect to the high harmonic component can be converted to the lower electrode impedance with respect to the high harmonic component by using the F-parameters of the high harmonic component stored in the F-parameters database 201 in advance. In addition, the plasma impedance to the fundamental component (or the high harmonic component) can be calculated from the lower electrode impedance to the fundamental component (or the high harmonic component) by using a relationship in which the plasma impedance to the fundamental component (or the high harmonic component) is the complex conjugate of the lower electrode impedance to the fundamental component (or the high harmonic component), and from the plasma impedance to the fundamental component (or the high harmonic component), the total capacitance $C_T$ of the sheath of the lower electrode side, the sheath of the upper electrode side, and the upper insulator ring 42 can be calculated. From the above, the high harmonic impedance Z as viewed from the plasma is calculated, and thus the degree of high harmonic generation can be calculated.

Figure 4:
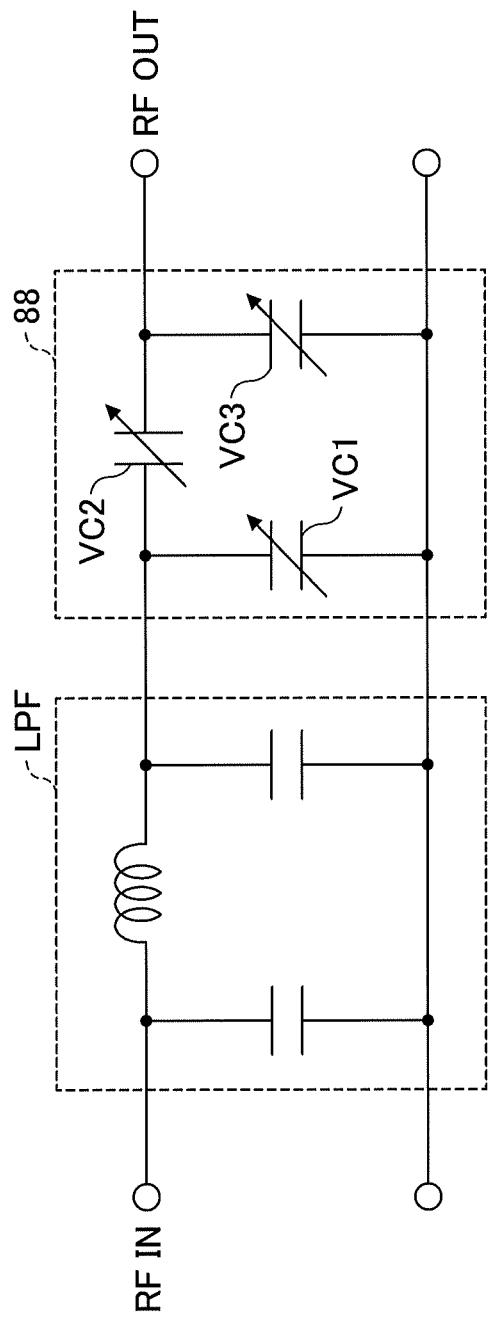
FIG. 4 illustrates an example of a configuration of a peripheral circuit of a matching device according to the embodiment.

As illustrated in FIG. 4, it is preferable that a low-pass filter (LPF) configured to prevent high harmonic components from flowing into the high frequency power supply 90 is disposed between the high frequency power supply 90 and the matching device 88. By blocking high harmonic components coming from the chamber 10 (lower electrode), when calculating the degree of high harmonic component generation, influence of the radio frequency power supply 90 and the feed rod 89 can be eliminated. However, the low-pass filter (LPF) needs not be disposed between the high frequency power supply 90 and the matching device 88.

[Method for Controlling Degree of High Harmonic Component Generation]

Figure 5:
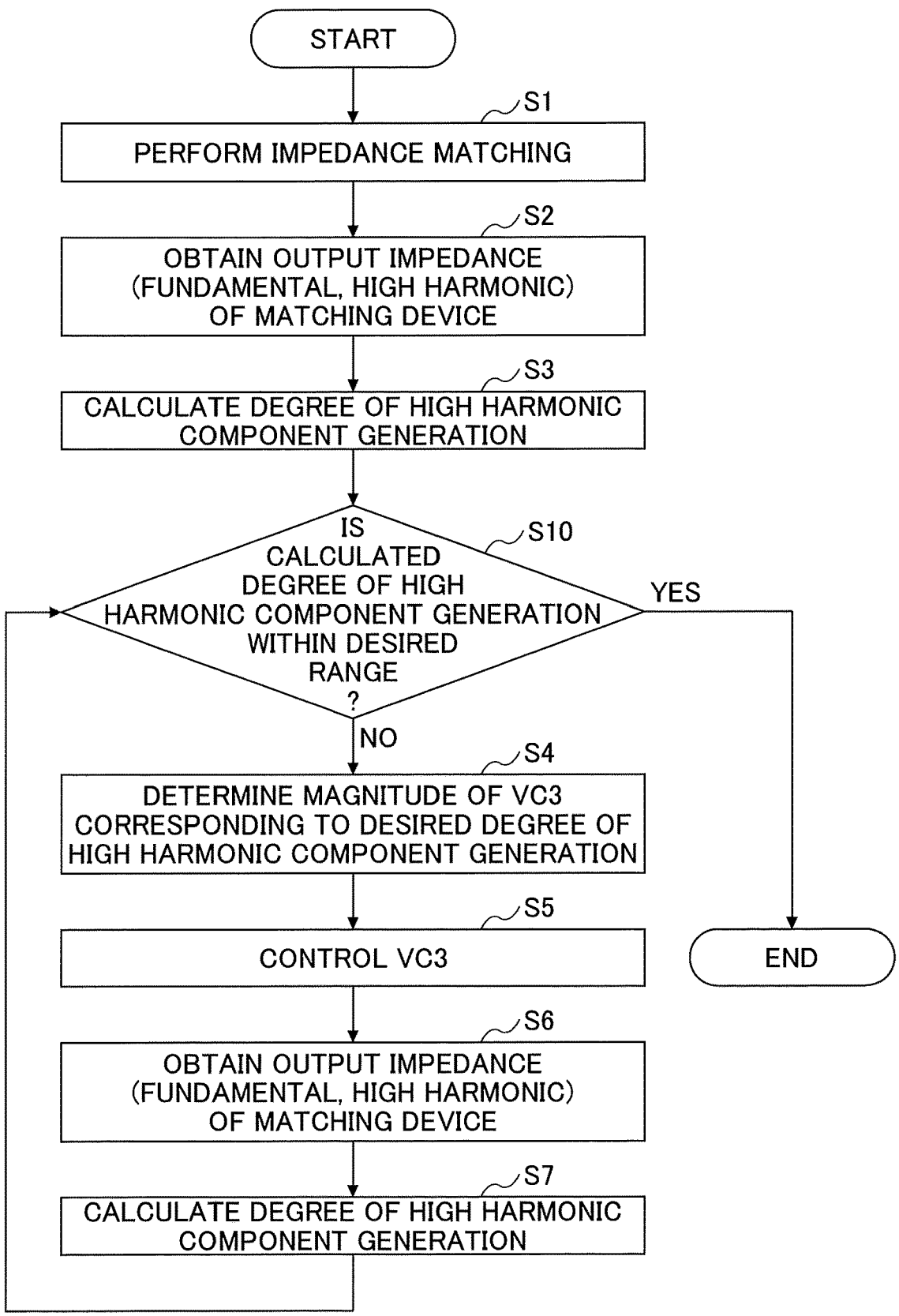
FIG. 5 illustrates a flowchart illustrating a method of controlling a degree of high harmonic component generation according to the embodiment.

Next, an example of a procedure of a method of controlling the degree of high harmonic component generation according to the present embodiment will be described with reference to a flowchart illustrated in FIG. 5. The method of controlling the degree of high harmonic component generation is performed by the controller 200 executing a program stored in a memory, which causes the controller 200 (the processor in the controller 200) to control the degree of high harmonic component generation.

When a process of control the degree of high harmonic component generation is started, the controller 200 causes the matching device 88 to perform an impedance matching process (step S1). That is, the matching device 88 controls magnitude of the variable capacitors VC1, VC2, and VC3 so that load impedance (impedance of the load seen from the high frequency power supply 90) is caused to approach a matching point, and completes the matching operation. In order to perform step S1, a matching device 88 that automatically performs an impedance matching operation may be employed. Next, in step S2, the controller 200 acquires output impedance (with respect to fundamental component and high harmonic component) of the matching device 88 in which impedance matching is achieved, by referring to the matching device output impedance database 202 and the magnitude of the variable capacitors VC1, VC2, and VC3.

Next, in step S3, the controller 200 calculates a degree of high harmonic component generation in accordance with the above-described formula (2) and the above-described calculation method.

Next, the controller 200 determines whether the calculated degree of high harmonic component generation is within a predetermined desired range (step S10). If it is determined that the calculated degree of high harmonic component generation is within the desired range, the controller 200 terminates the present process. Meanwhile, if it is determined that the calculated degree of high harmonic component generation is not within the desired range, the process proceeds to step S4.

Next, the controller 200 calculates (makes a reverse calculation of) magnitude of the variable capacitor VC3 corresponding to a desired degree of high harmonic component generation, by using the above-described formula (2), the matching device output impedance database 202, and the F-parameters database 201 (step S4). In step S4, the magnitude of the variable capacitor VC3 may not be uniquely determined (multiple candidates of VC3 may be calculated). In such a case, the controller 200 selects one value from among the multiple candidates, and determines the selected value as the magnitude of the variable capacitor VC3.

Next, in step S5, the controller 200 sets the variable capacitor VC3 to the calculated magnitude. Next, the controller 200 acquires output impedance (with respect to fundamental component and high harmonic component) of the matching device 88 again by referring to the matching device output impedance database 202 (step S6). Next, the controller 200 calculates a degree of high harmonic component generation in accordance with the above-described formula (2) and the above-described calculation method (step S7).

After step S7, step S10 is performed. In step S10, if it is determined that the calculated degree of high harmonic component generation is within the desired range, the controller 200 terminates the present process. Meanwhile, if it is determined that the calculated degree of high harmonic component generation is not within the desired range, the process returns to step S4. The controller 200 repeats the process from step S4 to step S7 until it is determined that the calculated degree of high harmonic component generation is within the desired range. For example, in a case in which multiple candidates of VC3 are calculated in step S4, the controller 200 repeats the process from step S4 to step S7 by changing a value to be selected in step S4.

Experimental Results

Lastly, examples of results of an experiment in which the controller 200 adjusts impedance to high harmonic components of the matching device in accordance with the process illustrated in FIG. 5 will be described with reference to FIG. 6. A process condition when performing the experiment is as follows.

<Process Conditions>
Pressure: 40 mTorr (5.33 Pa)
Gas type: $CF_4$ gas
RF power: 1000 W (frequency of fundamental component is approximately 40 MHz)

An experiment of etching a silicon oxide film ($SiO_2$) was performed under the above-described condition. The results are illustrated in columns NO. 1 to NO. 4 in FIG. 6.

A first row of FIG. 6 indicates lower electrode impedance with respect to a fundamental component of approximately 40 MHz. A second row indicates lower electrode impedance with respect to a high harmonic component of approximately 122 MHz, which is three times the fundamental component. A third row indicates calculation results of the total capacitance $C_T$ of a sheath on the lower electrode, a sheath on the upper electrode 34, and the upper insulator ring 42. A fourth row indicates high harmonic impedance seen from the plasma. A fifth row indicates degrees of high harmonic component generation calculated using the above-described formula (2). Graphs in the bottom row illustrates etch rates (E/R) of the silicon oxide films of the 300 mm diameter wafer. A horizontal axis of each of these graphs indicates a position on an X axis or a Y axis.

According to the above-described experimental results, as the calculated degree of high harmonic component generation is smaller, variation in the etching rate of the silicon oxide film becomes smaller and process uniformity on the wafer W becomes higher. As the calculated degree of high harmonic component generation is greater, variation in the etching rate of the silicon oxide film becomes larger. From the above results, it is found that etching characteristics on the wafer W can be controlled by adjusting the impedance to a high harmonic component using the variable capacitor VC3, in accordance with the calculated degree of high harmonic component generation.

In the experiment, the degree of high harmonic component generation was calculated using lower electrode impedance with respect to a third order harmonic (having a frequency of three times the fundamental component). This is because the third order harmonic has a strong influence on impedance adjustment, among harmonic components of second or larger order that are generated in the chamber 10. However, the present invention is not limited to a case in which the third order harmonic is used to calculate a degree of high harmonic component generation. A degree of high harmonic component generation may be calculated using lower electrode impedance with respect to other harmonic components, such as a second order harmonic or fourth order harmonic.

As described above, in the control method of the plasma processing apparatus 1 according to the present embodiment, a degree of high harmonic component generation is calculated by using output impedance of a matching device and F-parameters of the chamber 10. Impedance to a high harmonic component is then adjusted by controlling capacitance of the variable capacitor VC3 of the matching device 88 so that the calculated degree of high harmonic component generation is an optimal value. This allows impedance of the matching device with respect to a high harmonic component to be adjusted without using sensors such as an RF sensor or an impedance sensor. This allows an etching characteristic to be controlled. Also, because the above-mentioned sensors such as an RF sensor and an impedance sensor are expensive, by employing the control method according to the present embodiment, use of the expensive sensor is not required, which is preferable for mass production of the plasma processing apparatus.

In the above-described embodiment, in order to adjust impedance with respect to a high harmonic component, a case of calculating a degree of generation of a high harmonic component that is generated based on electric power from the high frequency power supply 90 for plasma generation is described, but is not limited thereto. A degree of generation of a high harmonic component may be calculated from a high harmonic component generated based on electric power from at least one of the high frequency power supply 90 for plasma generation and a high frequency power supply for attracting ions.

The control method and the plasma processing apparatus according to the present embodiment disclosed herein are to be considered exemplary in all respects and not limiting. The above embodiment may be modified and enhanced in various forms without departing from the claims and spirit thereof. Matters described in the above embodiment may take other configurations to the extent not inconsistent, and may be combined to the extent not inconsistent.

The plasma processing apparatus of the present disclosure is applicable to any types of plasma processing apparatuses, such as a capacity coupled plasma (CCP) type, an inductively coupled plasma (ICP) type, a radial line slot antenna (RLSA) type, an electron cyclotron resonance plasma (ECR) type, and a helicon wave plasma (HWP) type.

In the present specification, a wafer W has been described as an example of a substrate. However, the substrate may not be limited thereto, but may be various types of substrates used in a flat panel display (FPD), a printed circuit board, or the like.

What is claimed is:

1. A method of controlling a plasma processing apparatus including a chamber in which a plasma is generated, a substrate holder, a radio frequency power supply configured to supply radio frequency electric power to the substrate holder, a matching device provided between the substrate holder and the radio frequency power supply, the matching device including
- a first variable capacitor connected in parallel with the radio frequency power supply,
- a second variable capacitor connected in series with the radio frequency power supply, and
- a third variable capacitor for adjusting output impedance to a high harmonic component, the third variable capacitor being connected in parallel with the first variable capacitor and being disposed at a position closer to the substrate holder relative to the first variable capacitor and the second variable capacitor;

the method comprising:
- acquiring output impedance of the matching device in a state in which impedance matching is achieved;
- obtaining F-parameters indicating electrical characteristics of the chamber;
- calculating a degree of high harmonic component generation using the output impedance of the matching device and the F-parameters; and
- controlling impedance of the matching device based on the degree of high harmonic component generation; wherein the controlling includes adjusting capacitance of the third variable capacitor in the matching device.

2. The method according to claim 1, wherein the acquiring of the output impedance includes acquiring output impedance of the matching device with respect to a fundamental component and output impedance of the matching device with respect to a high harmonic component; and the degree of high harmonic component generation is calculated from impedance of the substrate holder calculated by using the F-parameters and the output impedance of the matching device with respect to the high harmonic component, and from plasma impedance with respect to the high harmonic component.

3. The method according to claim 1, wherein the plasma processing apparatus further includes a low-pass filter provided between the radio frequency power supply and the matching device, to prevent high harmonic components from flowing into the radio frequency power supply.

4. A plasma processing apparatus comprising a controller including a processor and a memory storing a program causing the processor to perform the method according to claim 1.

* * * * *